United States Patent
Bauer et al.

(10) Patent No.: US 11,245,977 B2
(45) Date of Patent: Feb. 8, 2022

(54) ELECTRIC COMPONENT WITH SENSITIVE COMPONENT STRUCTURES AND METHOD FOR PRODUCING AN ELECTRIC COMPONENT WITH SENSITIVE COMPONENT STRUCTURES

(71) Applicant: SNAPTRACK, INC., San Diego, CA (US)

(72) Inventors: Christian Bauer, Munich (DE); Hans Krüger, Munich (DE); Jürgen Portmann, Munich (DE); Alois Stelzl, Munich (DE); Wolfgang Pahl, Munich (DE)

(73) Assignee: Snaptrack, Inc., San Diego, CA (US)

( * ) Notice: Subject to any disclaimer, the term of this patent is extended or adjusted under 35 U.S.C. 154(b) by 370 days.

(21) Appl. No.: 15/532,454

(22) PCT Filed: Oct. 19, 2015

(86) PCT No.: PCT/EP2015/074148
§ 371 (c)(1),
(2) Date: Jun. 1, 2017

(87) PCT Pub. No.: WO2016/091438
PCT Pub. Date: Jun. 16, 2016

(65) Prior Publication Data
US 2017/0272855 A1    Sep. 21, 2017

(30) Foreign Application Priority Data
Dec. 9, 2014 (DE) .......................... 102014118214.6

(51) Int. Cl.
*H01L 27/12* (2006.01)
*H04R 1/22* (2006.01)
(Continued)

(52) U.S. Cl.
CPC .......... *H04R 1/222* (2013.01); *B81B 7/0061* (2013.01); *B81C 1/0023* (2013.01); *H01L 24/19* (2013.01);
(Continued)

(58) Field of Classification Search
CPC ............ H01L 23/481; H01L 23/49827; H01L 23/52–23/5389; H01L 41/053;
(Continued)

(56) References Cited

U.S. PATENT DOCUMENTS

2004/0046245 A1    3/2004 Minervini
2005/0034888 A1    2/2005 Hoffmann et al.
(Continued)

FOREIGN PATENT DOCUMENTS

CN    101006748 A    7/2007
CN    101325823 A    12/2008
(Continued)

OTHER PUBLICATIONS

Kruger et al., WO2014/090438A1, published Jun. 19, 2014.*
International Search Report and Written Opinion—PCT/EP2015/074148—ISA/EPO—dated Jan. 8, 2016.

*Primary Examiner* — Suberr L Chi
(74) *Attorney, Agent, or Firm* — Patterson & Sheridan, LLP

(57) ABSTRACT

The invention relates to a simple to produce electric component for chips with sensitive component structures. Said component comprises a connection structure and a switching structure on the underside of the chip and a support substrate with at least one polymer layer.

16 Claims, 5 Drawing Sheets

(51) Int. Cl.
*H04R 19/00* (2006.01)
*H04R 31/00* (2006.01)
*H01L 23/00* (2006.01)
*H04R 19/04* (2006.01)
*B81C 1/00* (2006.01)
*B81B 7/00* (2006.01)
*H04R 1/02* (2006.01)
*H04R 1/06* (2006.01)
*H04R 3/00* (2006.01)
*H04R 23/02* (2006.01)
*H03H 9/05* (2006.01)
*H01L 21/56* (2006.01)

(52) U.S. Cl.
CPC .............. *H01L 24/20* (2013.01); *H01L 24/97* (2013.01); *H04R 1/02* (2013.01); *H04R 1/06* (2013.01); *H04R 3/007* (2013.01); *H04R 19/005* (2013.01); *H04R 19/04* (2013.01); *H04R 23/02* (2013.01); *H04R 31/00* (2013.01); *B81B 2201/0257* (2013.01); *B81B 2207/012* (2013.01); *B81B 2207/098* (2013.01); *H01L 21/568* (2013.01); *H01L 2224/04105* (2013.01); *H01L 2224/24137* (2013.01); *H01L 2224/24195* (2013.01); *H01L 2224/73217* (2013.01); *H01L 2924/14* (2013.01); *H01L 2924/1461* (2013.01); *H01L 2924/19105* (2013.01); *H03H 9/058* (2013.01); *H03H 9/0523* (2013.01)

(58) Field of Classification Search
CPC ... H01L 41/083; H01L 41/1132; H01L 41/27; H01L 41/293; H01L 24/97
See application file for complete search history.

(56) References Cited

U.S. PATENT DOCUMENTS

| | | |
|---|---|---|
| 2007/0063129 A1 | 3/2007 | Chen |
| 2008/0079164 A1* | 4/2008 | Kurita ................. H01L 21/4857 257/759 |
| 2010/0283144 A1 | 11/2010 | Liang |
| 2013/0088941 A1* | 4/2013 | Elian ..................... B81B 7/0061 367/99 |
| 2014/0134796 A1* | 5/2014 | Kelly ...................... H01L 24/81 438/107 |
| 2015/0325780 A1 | 11/2015 | Krüger et al. |
| 2016/0307824 A1* | 10/2016 | Uzoh ................. H01L 21/4857 |
| 2017/0317264 A1* | 11/2017 | Tomiyoshi ................ B06B 1/06 |

FOREIGN PATENT DOCUMENTS

| | | |
|---|---|---|
| CN | 102082988 A | 6/2011 |
| CN | 102131139 A | 7/2011 |
| CN | 102378092 A | 3/2012 |
| CN | 102917303 A | 2/2013 |
| CN | 103491490 A | 1/2014 |
| CN | 103888879 A | 6/2014 |
| DE | 102005053765 A1 | 5/2007 |
| DE | 102009019446 A1 | 11/2010 |
| JP | 2005243787 A | 9/2005 |
| JP | 2008135594 A | 6/2008 |
| WO | WO-03058810 A1 | 7/2003 |
| WO | WO-2014090438 A1 | 6/2014 |

\* cited by examiner

ELECTRIC COMPONENT WITH SENSITIVE COMPONENT STRUCTURES AND METHOD FOR PRODUCING AN ELECTRIC COMPONENT WITH SENSITIVE COMPONENT STRUCTURES

The invention relates to simple to produce electric components and simple methods for producing such components.

Electric components, such as electric or electronic modules or so-called component packages or module packages, generally comprise one or more chips as well as one or more mechanically sufficiently stable support substrates and conductor paths for electrical interconnections between chips or between a chip and a support substrate. In this case, some electric components comprise chips that are to fulfill mechanical or electromechanical functions. While chips that exclusively comprise semiconductor technology-based, integrated circuits are still relatively insensitive to external influences, the integration of a mechanically active chip is problematic as a result of sensitive component structures.

From the publications U.S. Pat. No. 8,227,904 B2, US 2009/0101998 A1, or DE 102010006132 A1, electric components with chips interconnected with one another are known. The production of such components is complex, which is reflected in high production costs and non-optimal durability.

Therefore, there task exists to specify electric components, which can comprise several chips, in particular mechanically active chips, and electrical interconnections between them, which offer a suitable and protective environment for the chips, which are easily producible, and which offer a long service life. Accordingly, a simple method for producing such components is also to be specified.

These tasks are solved by the component and/or the method according to the independent claims. The dependent claims specify advantageous embodiments of the component or the method.

The electric component comprises a support substrate with at least one polymer layer. The component furthermore comprises a first chip with a connection structure and a metallic switching structure. Both, the connection structure and the metallic switching structure, are arranged on the underside of the chip. The first chip is arranged on the support substrate. The connection structure either rests on the polymer layer or protrudes into the polymer layer without completely penetrating through it. The switching structure penetrates through the polymer layer.

An electric component that comprises different structures on the underside of the chip is thus specified. The connection structure generally comprises a lower height, measured from the underside of the chip, than the switching structure. The switching structure can thus penetrate the polymer layer of the support substrate underneath the chip and be used for electrical interconnections, while the connection structure establishes a mechanical connection between the chip and the support substrate.

Since the polymer layer, as part of the support substrate, can be relatively soft or even liquid during production, electrical through-connections through this layer of the support substrate can be obtained by merely pressing the chip with its structures on its underside strongly enough onto the support substrate with the soft polymer layer as the top layer and subsequently curing the polymer layer. If an additional layer of the support substrate located underneath the polymer layer were to be subsequently removed, electrical connections to the chip would already exist at the underside of the support substrate.

Depending on the topology of the connection structure, a closed cavity can furthermore easily be obtained in a gap between the first chip and the support substrate, e.g. if the connection structure forms a frame structure that is closed all around.

In this case, it is possible that the first chip is an MEMS chip (MEMS=micro-electro-mechanical system), an NEMS chip (NEMS=nano-electro-mechanical system), an IC chip, an optoelectronic chip, an actuator chip, or a chip comprising only passive switching elements. In addition, the first chip may also be a combined chip comprising switching structures or components made of different chip categories mentioned above.

Due to the simplicity of components with contacts extending through substrate layers, the possibilities of error during production are reduced, which is why the service life of the components is increased.

The component is in this case not limited to comprise only one or a few chips. Rather, the component may comprise a second chip or a plurality of additional chips, which can, for example, be sensitive chips of the aforementioned categories in need of protection.

Furthermore, it is possible that the support substrate comprises a layer arranged underneath the polymer layer in addition to the aforementioned polymer layer. In this case, the layer may consist of one or more layers and may be a SESUB (semi-conductor-embedding substrate), a printed circuit board, an LTCC substrate (LTCC=low-Temperature co-fired ceramics), an HTCC substrate (HTCC=high-temperature co-fired ceramics), an organic substrate foil, an inorganic substrate foil, a metal foil, a monocrystalline substrate, a semiconductive substrate, a ceramic substrate, or a glass substrate. A layer combination of these materials suitable in principle as substrate material may also be arranged underneath the polymer layer, at least during the production of the component.

It is furthermore possible that the component comprises a gap between the first chip and the support substrate. Sensitive structures, such as MEMS component structures, are arranged on the underside of the first chip, without touching the support substrate. In this case, the installation height of the connection structure substantially defines the distance between the underside of the first chip and the top side of the polymer layer if the connection structure rests (preferably planarly) on the polymer layer. Since the connection structure may in particular be used to form a cavity between the chip and the support substrate, and since a hermetically sealed cavity is preferred in many applications, the connection structure may protrude somewhat into the polymer layer in order to ensure a tight closure even with a certain waviness of the polymer layer. The waviness of the polymer layer thus determines the smallest possible even distance between the chip and the support substrate. This distance may, for example, be 5 μm. The polymer layer may in this case be between 10 μm and 50 μm thick. Accordingly, an installation height of the connection structure of 5 μm or a few percent more than 5 μm results. The installation height of the switching structure (substantially) results as the distance between the chip and the support substrate plus the thickness of the polymer layer.

The (sensitive) component structures on the underside of the first chip may, for example, be SAW structures (SAW=surface acoustic wave), BAW structures (BAW=bulk acoustic wave), or electro-acoustic transducer structures of microphone chips. Such structures generally require a certain distance to neighboring surfaces in order to be able to vibrate freely.

It is therefore moreover possible that the gap between the first chip and the support substrate is delimited laterally by the connection structure formed as frame on the underside of the chip. This frame, the chip, and the support substrate thus enclose a cavity. The frame may have a rectangular shape. Other shapes, such as polygons with three, five, six, seven, eight, or more corners, which are connected via straight connecting elements of the frame, or frames with curved segments are also possible.

In addition to the frame, the connection structure may also comprise additional elements, which are arranged, for example as spacers, inside or outside the frame and ensure an even distance between the chip and the support substrate, even if a force is exerted on the chip. Such spacers may in particular be so-called pillars.

It is possible that the connection structure on the underside of the first chip comprises as main component a polymer, Cu (copper), Al (aluminum), Ag (silver), or Au (gold), or additional metals. The switching structure may also comprise, for example, Cu, Al, Ag, or Au as a metallic main component or a polymer with electrically conductive, metallic nanoparticles made of these metals.

Of the metals as main component, in particular Cu is preferred for both the connection structure and the switching structure, since Cu is compatible with standard CMOS processes, has a good electrical conductivity, has good mechanical rigidity values, and withstands an oxidizing atmosphere during production processes for a sufficiently long time.

Of the non-metallic main components, a polymer has the advantage that it can be positioned precisely by means of jetting with a polymer printer with a good lateral resolution and produced in a sufficient thickness. If the polymer material to be jetted comprises metal, e.g. in the form of metallic nanoparticles, electrically conductive structures with a three-dimensional profile can even be printed.

It is possible that the switching structure comprises one or more bump connections or metallic pillars between the chip and the support substrate or a through-connection through the chip and/or the support substrate.

It is furthermore possible that the connection structure comprises supports having a round or rectangular cross section (pillars), or supporting frames.

In particular, if the chip on the support substrate is surrounded by a mold mass during a production process, high pressures can act on the chip. By providing supporting elements as elements of the connection structure between the chip and the support substrate, the position of the chip and in particular the possibly more sensitive, electrical switching structures can be stabilized.

Supporting connection structures between the chip and the support substrate can furthermore reduce or even compensate negative effects between the chip and the support substrate as a result of different expansion coefficients of the materials.

It is possible that the component comprises a second chip. The second chip can be arranged above or directly on the first chip. It is also possible that the second chip is arranged next to the first chip on the support substrate.

Such a component thus comprises two chips. One of the two chips may comprise mechanically active component structures, while the respectively other chip contains integrated circuits, in which an ASIC (ASIC=application-specific integrated circuit) is, for example, realized. In this way, the chip carrying mechanical component structures may, for example, be a microphone chip with a freely vibrating, electrically conductive membrane and an electrically conductive backplate, while the other chip comprises an analog or digital evaluation logic in order to be able to output electrically coded output signals of a received acoustic signal.

It is possible that the component furthermore comprises an encapsulation with a laminate, a mold mass, a mass applied by a printing process, or a foil above the first chip and/or a filler material arranged directly on a region of the support substrate.

The filler material (such as a so-called underfiller) may in this case fill a gap between a chip material, such as of the first or an additional chip, and the support substrate in order to establish a stable connection between the chip and the support substrate or seal a cavity underneath a chip.

It is furthermore possible that the component comprises a cover layer made of metal on top of the first chip or on top of additional chips. The cover layer made of metal may in this case be in direct contact with the chip. It is also possible that the metal of the cover layer is one of the top layers of the component and electromagnetically shields all layers located underneath it.

If chips arranged next to each other are spaced apart at a distance that may, for example, be larger than 200 µm, it is possible to pull a covering foil down to the surface of the substrate.

If chips arranged next to each other are spaced apart at a distance that is, for example, smaller than 50 µm, the foil can constitute a part of an enclosing environment of a cavity if it is not pulled down to the substrate.

If the cover layer comprises one or more layers with a high acoustic contrast, a labeling of the component may be obtained by selective removal.

It is possible that the first chip or an additional chip is a sensor chip. The chip can be arranged below a covering. In order for the sensor chip to be able to communicate with the environment of the component and analyze pressure ratios or different gas compositions, for example, it is connected via a hole in the covering to the environment.

It is possible that the component is a microphone. The sensor chip then comprises electro-acoustic transducer structures, such as a membrane and a backplate. Below the covering, a rear volume is formed.

The signal quality that a microphone can provide depends on the so-called rear volume, among other things. The rear volume is the volume of the space located behind the membrane in the acoustic direction. The smaller the rear volume is, the higher is the counter-pressure, which acts against a deflection of the membrane in the direction of sound propagation. For this reason, large rear volumes are preferred. However, since the ongoing trend of miniaturization opposes large rear volumes, it is always preferred to specify microphones with large rear volumes but small overall dimensions. If the electric component comprises additional switching elements in addition to the first chip, these switching elements can be arranged underneath a common covering and the space between the chips underneath the covering can be used as enlarged rear volume.

The provision of recesses in the support substrate may also serve to enlarge a rear volume.

It is possible that the component also comprises at least one additional chip in addition to the first chip. The additional chip is also arranged on the top side of the support substrate. Extending on the top side of the support substrate, the connecting path between the chips is so long that the support substrate can be bent at a bending line extending between the chips, without the chips touching each other or impairing each other otherwise. If several such bending lines are provided, a component with a primarily large surface may be folded together to form a compact component. The folded component can later be cast with a casting compound, so that a mechanically stable, cast component with precisely defined distances between the different switching elements is obtained.

It is furthermore possible that the component on the top side of the support substrate comprises exposed conductor paths and/or contact surfaces, which are provided to be connected to and interconnected with an external circuit environment via a plug connection. The conductor paths preferably end at the edges of the support substrate. There, the conductor paths are preferably widened to form contact pads. The component thus forms a plug, which can be easily plugged into a respectively adapted socket. Such a plug connection has the advantage that it constitutes an electrical interconnection and a mechanical connection at the same time and that it is easy to release. A defect component can thus easily be exchanged.

A method for producing an electric component comprises the provision of a first chip. On the underside of the first chip, a metallic connection structure and a metallic switching structure are formed. Both the connection structure and the switching structure have different heights.

Furthermore, a support substrate with a sufficiently soft polymer layer is provided.

The first chip and the support substrate are connected. In doing so, the switching structure penetrates through the polymer layer, which is sufficiently soft for this purpose. The switching structure touches the polymer layer or penetrates it slightly without penetrating completely through it.

It is possible and, depending on the viscosity of the polymer layer, necessary to cure the polymer layer after the first chip is placed on the polymer layer constituting an essential part of a support substrate. The polymer layer can in this case be cured by exposure to light or by heating.

If the polymer layer is cured by heating, the presence of the connection structure underneath the first chip has an advantageous effect since different coefficients of thermal expansion may exist.

It is possible that underneath the polymer layer, the support substrate comprises a layer that is transparent in a suitable optical wavelength range. The curing of the polymer layer then preferably takes place by exposing it to light of this wavelength range. In doing so, the optical wavelength range is suitable, in which the curing of the polymer layer is quite possible. A curing of the polymer layer may easily take place in particular by UV radiation.

Next to or on the first chip, an additional chip or a plurality of additional chips may be arranged.

It is possible that a filler material, such as an underfiller, is arranged in the regions between a chip material and the support substrate.

Because the connection structures can form a frame around a cavity, a filler material can be applied extensively on the top side of the support substrate without risk of flooding the cavity.

It is possible that a mold mass and/or a foil is applied over the first chip.

It is furthermore possible that a metallic cover layer is applied on the first chip or over the first chip.

It is possible that the support substrate comprises an additional layer underneath the polymer layer and that the additional layer is removed completely or selectively in the regions of the switching structure after curing of the polymer layer and that the switching structure is exposed in the process.

The exposing of the switching structure may in this case be carried out using a laser.

The switching structure may comprise contacts. After the exposing, the contacts of the switching structure are contacted by forming conductor structures on the underside of the support substrate.

In order to form the conductor structures, usual lithography processes may be used.

It is possible that a plurality of components is simultaneously produced in multiple applications. After all elements are combined for all components, the individual components can be separated.

It is possible that layer combinations with high optical contrast are deposited on the top side of the component. Such layer combinations may, for example, comprise layers with copper, nickel, and black nickel. The component is subsequently labeled by selective removal of the nickel-containing material.

It is possible that electrically conductive structures are formed on the surface of the chip and/or on the surface of the support substrate by depositing a metal or an alloy or by jetting metal-containing particles, such as nanoparticles. Electrically conductive structures may thus be produced by galvanic or non-electrical processes or by printing with a suitable printer.

Chips can be stacked on top of one another and interconnected with each other or with the substrate by through-connections.

For this purpose, rewiring layers may also be arranged on a chip surface, via which rewiring layers contacts are interconnected in different lateral positions.

Soldered electrical connections, e.g. between the chips and the substrate or between the chips themselves, may for example be established using hot bar soldering.

The essential features of the component or of the method are subsequently explained in more detail with reference to the schematic, non-limiting figures.

BRIEF DESCRIPTION OF THE DRAWINGS

FIG. 6 shows the essential geometric dimensions or structure heights of the connection structure VBS and the switching structure VSS relative to the thickness of the polymer-containing top layer of the support substrate TSO. The connection structure VBS and the switching structure VSS are arranged on the underside of the first chip CH1. The height of the switching structure VSS exceeds the height of the connection structure VBS. The connection structure VBS substantially serves to maintain a distance between the underside of the first chip CH1 and the top side of the support substrate TS. In doing so, the connection structure VBS touches the top layer TSO of the support substrate TS, which top layer substantially consists of a polymer material. It is possible that the connection structure VBS substantially sits on the top side of the top layer TSO or is possibly slightly pressed into the top layer TSO.

As a result of its larger height, the switching structure VSS penetrates through the polymer-containing top layer TSO of the support substrate TS. If an electrical contact to elements of the switching structure VSS is to take place at a later time, only the bottom layer of the support substrate TSU must be penetrated. In this case, the top layer TSO can substantially remain and ensure a mechanical stability.

Figure 1:
FIG. 1: a bottom support substrate layer TSU serving as base for the polymer layer.

FIGS. 1 to 5 show essential steps for producing such a component:

FIG. 1 shows the base layer of the support substrate, namely a bottom layer TSU of the support substrate.

Figure 2:
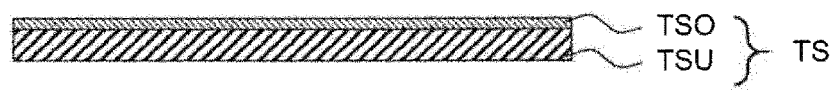
FIG. 2: a support substrate with a top support substrate layer TSO.

A polymer-containing top layer TSO is applied onto it (FIG. 2). The top layer is in this case so soft that the switching structure VSS can later easily penetrate through it. It is in particular possible that the top layer TSO is liquid.

Figure 3:
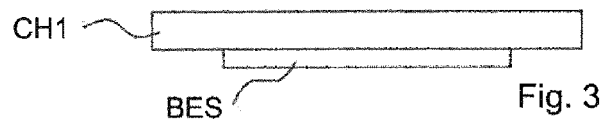
FIG. 3: a first chip CH1 with component structures BES on its underside.

FIG. 3 shows a first chip CH1, which carries sensitive component structures BES on its underside, such as SAW structures, BAW structures, or membranes, or backplates. The component structures are characterized in that they are arranged on the underside of the first chip CH1 so as to freely vibrate in order to ensure a proper function.

Figure 4:
FIG. 4: the first chip, on the underside of which a switching structure VSS has been formed in the meantime.

FIG. 4 shows how a switching structure VSS may be arranged on the underside of the first chip CH1 in order to interconnect, for example, the component structures with an external circuit environment or with additional switching elements of the component.

Figure 5:
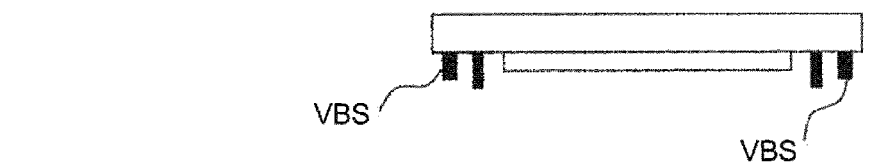
FIG. 5: a version of the chip, on the underside of which a connection structure VES is furthermore arranged.

FIG. 5 additionally shows the connection structure VBS on the underside of the first chip. In order to be able to maintain a sufficient distance between the component structures BES and the support substrate TS provided for them, the connection structure VBS preferably has a larger installation height than the component structures BES.

Figure 6:
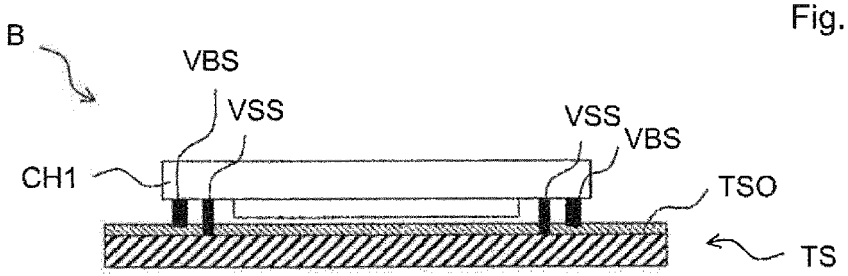
FIG. 6: the arrangement of the first chip CH1 on the support substrate TS.

In this way, after connecting the first chip CH1 to its structures on its underside and to the support substrate TS, the component shown in FIG. 6 is obtained, in which the component structures have a sufficient distance to the support substrate TS. If the connection structure VBS is self-contained, a closed cavity is obtained in particular, in which the component structures are arranged.

Figure 7:
FIG. 7: the arrangement of a second chip CH2 on the support substrate TS.

Furthermore, FIG. 7 shows a portion of the support substrate TS, on which a second chip CH2 is arranged. The second chip does not need to comprise any sensitive component structures on its surface. Therefore, a direct contact of its underside to the support substrate TS is harmless. Connection structures between the second chip CH2 and the support substrate TS are possible but not necessary.

Figure 8:
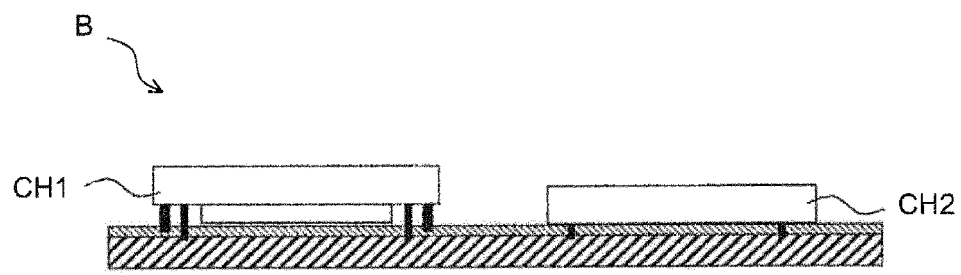
FIG. 8: a portion of the support substrate, on which the first chip CH1 and the second chip CH2 are arranged next to each other.

FIG. 8 now shows a component B, in which a first chip CH1 with mechanically sensitive component structures on its underside is arranged on the support substrate together with a less sensitive second chip CH2. Both chips comprise electrical contact structures on their undersides, which contact structures extend through the polymer-containing top layer of the support substrate TS.

Figure 9:
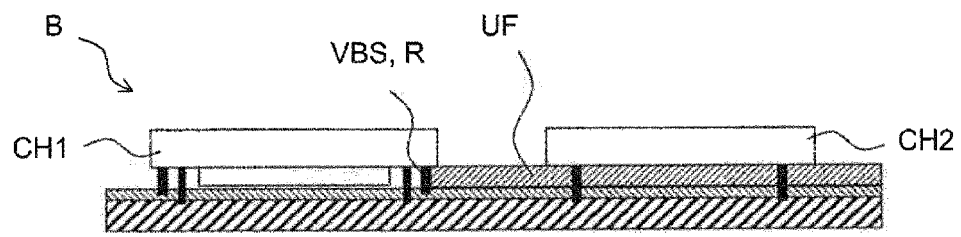
FIG. 9: a filler material UF in a gap between the second chip CH2 and the support substrate.

FIG. 9 shows an embodiment, in which the second chip CH2 is not in direct contact with the support substrate. If a free space between the second chip CH2 and the support substrate TS is undesired, the volume underneath the second chip CH2 can be filled with a filler material, such as an underfiller UF.

Since the connection structure VBS of the first chip CH1 may be designed as an annularly closed frame R, the sensitive component structures on the underside of the first chip CH1 are also not compromised by the application of the underfiller UF. Rather, the filler material UF can improve a hermetical sealing of the cavity underneath the first chip CH1.

Figure 10:
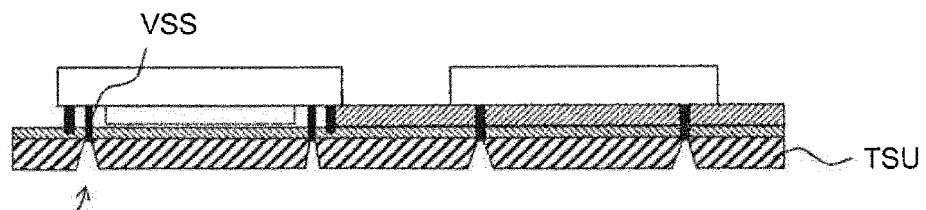
FIG. 10: a support substrate, in the bottom layer TSU of which holes L are structured.

FIG. 10 shows a substantial advantage of the present design compared to conventional components for the case that the switching structures VSS are to be contacted electrically. The top layer of the support substrate has preferably been cured in the meantime and can provide a sufficient mechanical stability. It is then only necessary to penetrate through the layers TSU located underneath and to thereby expose the switching structures VSS in order to carry out an interconnection of the switching structures by forming signal lines. In this way, holes L may be drilled, for example using a laser, into the layer TSU of the support substrate TS, said layer being arranged underneath the polymer layer.

Figure 11:
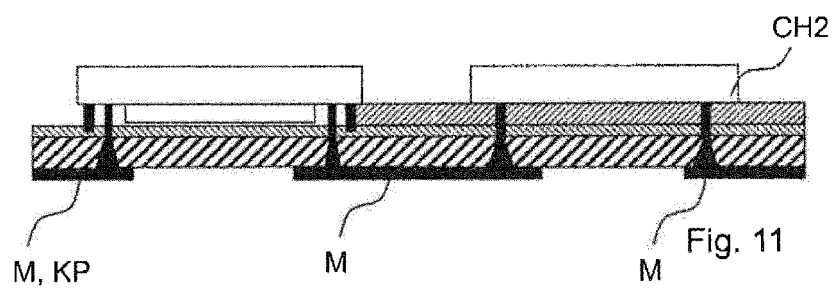
FIG. 11: metalizations M on the underside of the support substrate, which metalizations realize contact pads KP and signal paths between different electrical contacts of the chips.

FIG. 11 shows the metalizations M arranged via usual lithography processes on the underside of the support substrate and interconnecting the electrical contacts of the chips with one another or the contacts of the chips and external contact pads KP.

Figure 12:
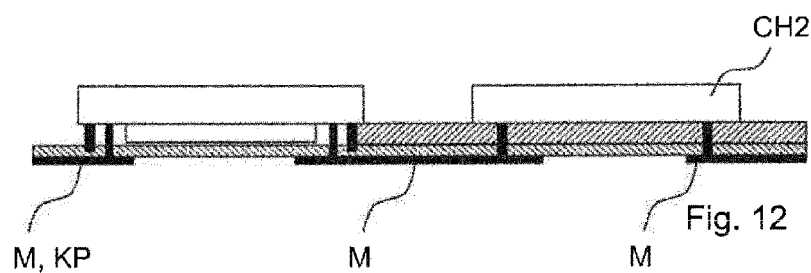
FIG. 12: an embodiment of the support substrate, which, after the curing of the polymer layer, no longer comprises any additional layers except for the polymer layer.

FIG. 12 shows an embodiment, in which individual holes L are not selectively drilled on the positions of the switching structure VSS, but the bottom layer TSU of the support substrate TS is completely removed before the metalization M is applied on the underside to form signal paths.

Figure 13:
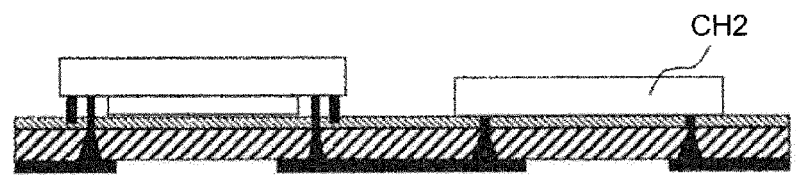
FIG. 13: the direct arrangement of the second chip CH2 on the polymer layer without additional filler material.
Figure 14:
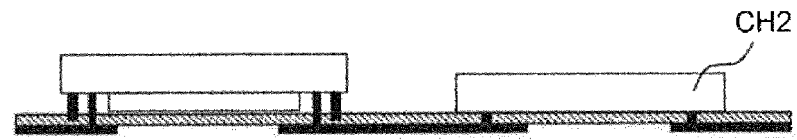
FIG. 14: a support substrate, which is not reinforced by a filler material underneath the second chip.

FIGS. 13 and 14 show the respective electrical connections on the underside of the support substrate, wherein no filler material is arranged between the support substrate and the second chip CH2. Depending on the thickness and stability of the polymer layer, the latter already provides a sufficient mechanical stability (FIG. 14).

Figure 15:
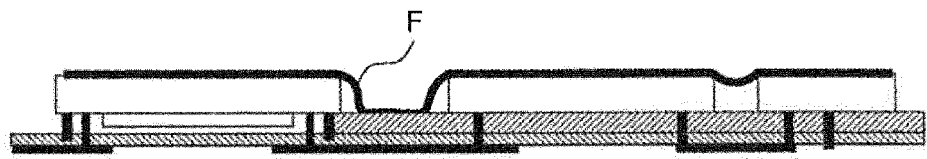
FIG. 15: a foil F, which is arranged over the chips on the top side of the support substrate.

FIG. 15 shows another possibility of covering the top side of the component by a foil F. Depending on how far the chips are spaced apart from each other on the top side of the support substrate, it is possible to connect the foil F to the top side of the support substrate or to enclose a cavity between the chips underneath the foil. If the foil touches the top side of the support substrate, the foil can be interconnected with an electric potential, e.g. via through-connections through the support substrate. It is furthermore possible to separate a support substrate produced accordingly in multiple applications in order to obtain a plurality of different components, wherein the sealing of the foil is not undermined by the separation. If the foil, together with the support substrate and the lateral surfaces of the chips, forms cavities, they may be formed as rear volumes for microphones.

Figure 16:
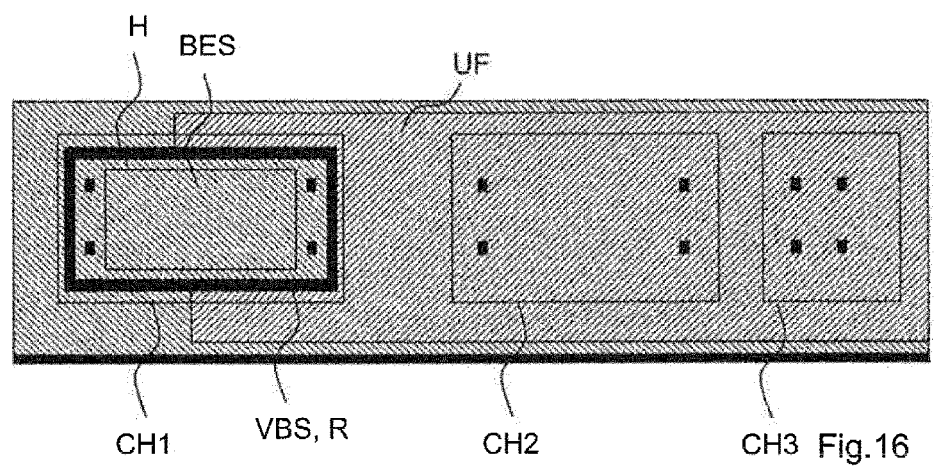
FIG. 16: a top view of a component, illustrating the effect of the frame-shaped connection structure as barrier against a filler material.

FIG. 16 shows the protective effect of a connection structure VBS formed as a frame, which connection structure effectively prevents a flooding of the cavity H underneath the first chip CH1 by the filler material UF. The component structures BES are thus safely accommodated in the cavity H.

In addition to the first chip CH1, an additional chip CH2 and a third chip CH3 are arranged on the top side of the support substrate.

Figure 17:
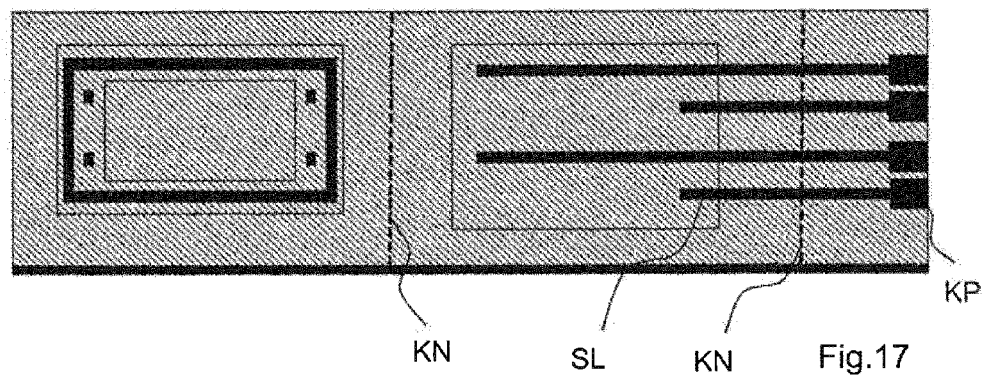
FIG. 17: a component with signal lines and contact pads on the top side of the support substrate for forming a plug connection.

FIG. 17 shows the possibility of forming signal lines SL by means of metalizations on the surface of the support substrate.

The signal lines may in this case extend from the contacts of one of the chips to an edge of the component and end in a contact pad KP. A plug connection to an external switching environment is thus easily made possible.

Bending lines KN may be selected such that chips or other switching elements still have sufficient room on the top side of the support substrate after the support substrate has been bent at the bending edge KN. After the bending, the support substrate may be cast with its components on the surface by means of a casting material, such as a polymer or a synthetic resin.

Figure 18:
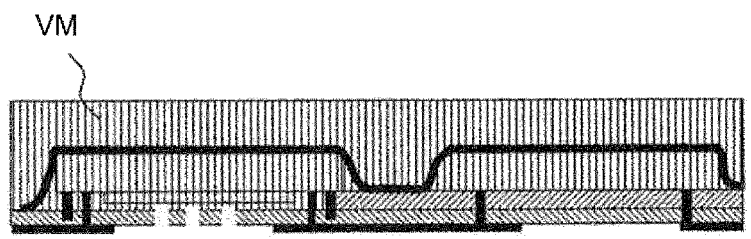
FIG. 18: a component with a casting compound VM.

Such a casting compound is shown in FIG. 18. In doing so, the casting compound covers the entire top side of the component.

Figure 19:
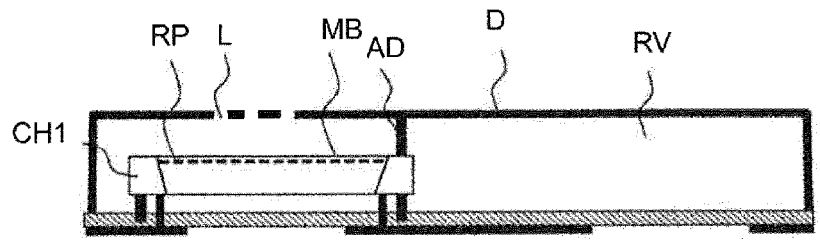
FIG. 19: a component designed as a microphone with a rear volume underneath a cover.

FIG. 19 shows an embodiment of the component as a microphone. The first chip CH1 carries a membrane MB and a backplate RP as component structures. The top side of the support substrate is covered by a cover D. In the cover D, holes are structured as sound entry openings. The cover D furthermore comprises a rear volume RV next to the first chip CH1. In order to avoid an acoustic short circuit, an acoustic seal AD is formed between the sound entry and the rear volume RV. The connection structure is in this case not completely closed so that a gas exchange between the volume behind the membrane MB of the first chip CH1 and the rear volume RV is possible.

Figure 20:
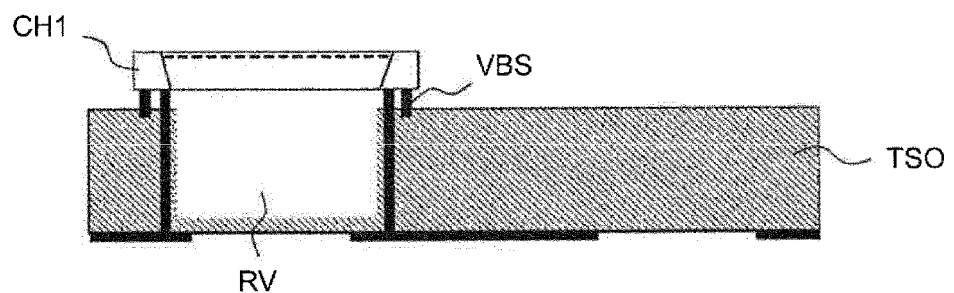
FIG. 20: a component designed as a microphone with a rear volume in a recess underneath the first chip.

FIG. 20 shows the possibility of providing the rear volume behind the membrane by means of a recess in the support substrate or its top layer TSO.

The thicker the top layer of the support TSO is, the larger is the rear volume RV. The switching structures are in this case long enough to penetrate completely through the top layer TSO.

Figure 21:
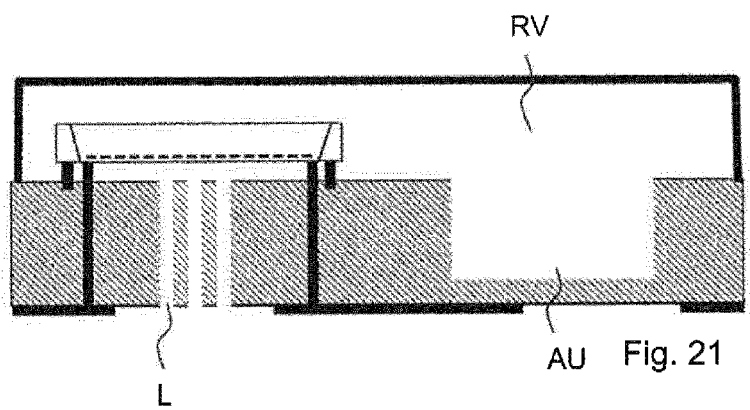
FIG. 21: an embodiment of the component as a microphone, in which a large portion of the rear volume is arranged in a recess next to the electro-acoustic transducer chip.

FIG. 21 shows another embodiment of the component as a microphone, in which a portion of the rear volume is formed by a recess AU in the support substrate next to the first chip. Additional holes L through the support substrate constitute a sound entry opening. In this exemplary embodiment, the connection structures are annularly closed in order to avoid an acoustic short circuit.

Neither the component nor the method for producing a component are limited to the embodiments shown or described.

LIST OF REFERENCE SYMBOLS

AU: Recess
B: Component
BES: Component structures
CH1: First chip
CH2: Second chip
CH3: Third chip
D: Cover
F: Foil
H: Cavity
KN: Bending line
KP: Contact pad
L: Hole
M: Metalization
MB: Membrane
R: Frame
RP: Backplate
RV: Rear volume
SL: Signal conductor
TS: Support substrate
TSO: Top layer of the support substrate
TSU: Layer underneath the top layer of the support substrate
UF: Filler material or underfiller
VBS: Connection structure
VM: Casting compound
VSS: Switching structure

The invention claimed is:

1. An electronic component comprising:
a support substrate comprising at least one polymer layer,
a first chip comprising a connection structure on an underside of the first chip and an electrical contact structure on the underside of the first chip,
wherein:
the first chip is arranged on the support substrate,
the connection structure is in contact with the at least one polymer layer or protrudes into the at least one polymer layer without penetrating through the at least one polymer layer, and
the electrical contact structure penetrates through the at least one polymer layer, and
a second chip arranged adjacent to the first chip, in contact with the at least one polymer layer, and having an electrical contact structure on an underside of the second chip, wherein the electrical contact structure of the first chip is coupled to the electrical contact structure of the second chip by metalizations forming signal paths.

2. The electronic component according to claim 1, wherein the first chip is selected from a group consisting of: an MEMS chip, an NEMS chip, an IC chip, an optoelectronic chip, an actuator chip, and a chip comprising only passive switching elements.

3. The electronic component according to claim 1, wherein the support substrate furthermore comprises a layer selected from a group consisting of: an SESUB, a printed circuit board, an LTCC substrate, an HTCC substrate, an organic support foil, an inorganic support foil, a metal foil, a monocrystalline substrate, a polycrystalline substrate, a semiconductive substrate, a ceramic substrate, and a glass substrate.

4. The electronic component according to claim 1, further comprising a gap between the first chip and the support substrate, wherein sensitive structures are arranged on the underside of the first chip without touching the support substrate.

5. The electronic component according to claim 4, wherein the gap is delimited laterally by the connection structure formed as a frame on the underside of the first chip and wherein the first chip, the frame, and the support substrate enclose a cavity.

6. The electronic component according to claim 1, wherein:
   the connection structure comprises as main component a polymer, Cu, Al, Ag, or Au, and
   the electrical contact structure of the first chip comprises as main component Cu, Al, Ag, or Au.

7. The electronic component according to claim 1, wherein the electrical contact structure of the first chip comprises:
   a bump connection or metallic pillars or
   a through-connection through the first chip and/or the support substrate.

8. The electronic component according to claim 1, wherein the connection structure comprises supports having a round or rectangular cross section or supporting frames.

9. The electronic component according to claim 1, wherein the second chip is arranged at a height equal to or less than a height of the first chip.

10. The electronic component according to claim 1, further comprising at least one of:
    an encapsulation with a laminate, a mold mass, a mass applied by a printing method, or a foil above the first chip, or
    a filler material arranged directly on a region of the support substrate and filling a gap between a chip material and the support substrate.

11. The electronic component according to claim 1, further comprising a cover layer made of metal over the first chip.

12. The electronic component according to claim 1, in which the first chip or an additional chip is a sensor chip and arranged underneath a covering, and wherein the sensor chip is connected to an environment of the component via a hole in the covering.

13. The electronic component according to claim 12, wherein:
    the component is a microphone,
    the sensor chip comprises electro-acoustic transducer structures, and
    a rear volume is formed below the covering.

14. The electronic component according to claim 1, comprising at least one additional chip, wherein the additional chip is arranged on a top side of the support substrate and a connecting path on the support substrate between the first chip and the additional chip is so long that the support substrate can be bent between the chips.

15. The electronic component according to claim 1, further comprising, on the top side of the support substrate, exposed conductor paths provided to be connected to and interconnected with an external circuit environment via a plug connection.

16. The electronic component according to claim 1, wherein the second chip has a lower mechanical sensitivity than a mechanical sensitivity of the first chip.

* * * * *